United States Patent [19]
Tuthill

[11] Patent Number: 5,982,221
[45] Date of Patent: Nov. 9, 1999

[54] SWITCHED CURRENT TEMPERATURE SENSOR CIRCUIT WITH COMPOUNDED $\Delta V_{BE}$

[75] Inventor: Michael G. Tuthill, Limerick, Ireland

[73] Assignee: Analog Devices, Inc., Norwood, Mass.

[21] Appl. No.: 08/910,676

[22] Filed: Aug. 13, 1997

[51] Int. Cl.[6] .................................................. H01L 35/00
[52] U.S. Cl. .......................................... 327/512; 374/178
[58] Field of Search .................................... 327/512, 513; 374/170, 178

[56] References Cited

U.S. PATENT DOCUMENTS

| | | | |
|---|---|---|---|
| 4,331,888 | 5/1982 | Yamauchi | 340/598 |
| 5,066,140 | 11/1991 | Beran | 374/134 |
| 5,195,827 | 3/1993 | Audy et al. | 374/172 |
| 5,213,416 | 5/1993 | Neely et al. | 374/178 |

OTHER PUBLICATIONS

Brokaw, Paul, "A Simple Three–Terminal IC Bandgap Reference", Reprinted from IEEE J. Solid–State Circuits, vol. SC–9, pp. 388–393, Dec. 1974.

Bakker et al., "Micropower CMOS Temperature Sensor with Digital Output", IEEE 1996.

Freire et al., "A p–n Junction Temperature Sensor with Switched Current Excitation", IEEE 1993.

Primary Examiner—Kenneth B. Wells
Attorney, Agent, or Firm—Iandiorio & Teska

[57] ABSTRACT

A switched current temperature sensor circuit with compounded $\Delta V_{BE}$ includes an amplifier having an inverting input with a corresponding non-inverting output, and a non-inverting input with a corresponding inverting output; a first PN junction connected to the non-inverting input through a first input capacitor and a second PN junction connected to the inverting input through a second input capacitor; a current supply including a low current source and a high current source; a switching device for applying in the auto zero mode the high current source to a first terminal of the first PN junction and the low current source to a first terminal of the second PN junction for providing the $V_{BE1}$ of the first junction to the first capacitor and for providing the $V_{BE2}$ of the second junction to the second capacitor and for applying in the temperature measurement mode the low current source to the first terminal of the first PN junction and the high current source to the first terminal of the second PN junction for providing the negative $\Delta V_{BE1}$ of the first PN junction to the first capacitor and the positive $\Delta V_{BE2}$ of the second PN junction to the second capacitor. The first feedback capacitor interconnected between the inverting output and non-inverting input and a second feedback capacitor interconnected between the non-inverting output and inverting input in the amplifier to define the gain on each of the $\Delta V_{BE}$ inputs to produce a differential voltage across the outputs representative of the average temperature of the PN junctions; and first and second reset switching devices for discharging the first and second feedback capacitors, respectively, and for enabling the amplifier to equalize its input in the auto-zero mode.

9 Claims, 6 Drawing Sheets

SWITCHED CURRENT TEMPERATURE SENSOR CIRCUIT WITH COMPOUNDED $\Delta V_{BE}$

FIELD OF INVENTION

This invention relates to a switched current temperature sensor circuit with compounded $\Delta V_{BE}$.

BACKGROUND OF INVENTION

Temperature sensing circuits which use $\Delta V_{BE}$ to measure the temperature of a PN junction are known both in the discrete time or switched construction and in the continuous time construction and in various fabrication technologies including CMOS. One problem with such circuits is that the $\Delta V_{BE}$ signal used to measure the junction temperature is small giving rise to low signal to noise ratios and consequent noise problems. One approach is to use sufficient filtration and amplification to obtain a strong clean signal, but this requires more complex, larger and more expensive circuitry. Another approach is to increase the current density ratio by increasing the current or the size of the junction area, but this solution is limited as the increase in $\Delta V_{BE}$ with current density ratio falls off rapidly.

SUMMARY OF INVENTION

It is therefore an object of this invention to provide an improved switched current temperature sensor circuit.

It is a further object of this invention to provide such a switched current temperature sensor circuit which increases the $\Delta V_{BE}$ voltage.

It is a further object of this invention to provide such a switched current temperature sensor circuit which has an improved signal to noise ratio.

It is a further object of this invention to provide such a switched current temperature sensor circuit which increases $\Delta V_{BE}$ independent of the current density ratio of the PN junction.

It is a further object of this invention to provide such a switched current temperature sensor circuit in which the $\Delta V_{BE}$ can be increased or compounded without limit.

It is a further object of this invention to provide such a switched current temperature sensor circuit in which the PN junctions need not be matched.

It is a further object of this invention to provide such a switched current temperature sensor circuit in which the amplifier offset error and low frequency noise are easily corrected.

The invention results from the realization that an improved switching current temperature sensor circuit with increased $\Delta V_{BE}$ can be effected without increasing the current density ratio by simultaneously developing opposite polarity $\Delta V_{BE}$'s and applying them through capacitors to the differential inputs of an amplifier to produce an output, scaled by feedback networks, which is a function of the combined or compounded $\Delta V_{BE}$'s, and the further realization that, by switching the capacitors as well as the current sources with respect to the junctions, the opposite polarity $\Delta V_{BE}$'s can be stacked to successively increase the compounded $\Delta V_{BE}$'s to any desired level.

This invention features a switched current temperature sensor circuit with compound $\Delta V_{BE}$ including an amplifier having an inverting input with a corresponding non-inverting output, and a non-inverting input with a corresponding inverting output. There is a first PN junction connected to the non-inverting input through a first input capacitor and a second PN junction connected to the inverting input through a second input capacitor. A current supply includes a low current source and a high current source. A switching device applies in the auto zero mode the high current source to a first terminal of the first PN junction and the low current source to a first terminal of the second PN junction for providing the $\Delta V_{BE1}$ of the first junction to the first capacitor and providing the $V_{BE2}$ of the second junction to the second capacitor. In the temperature measuring mode the switching device applies the low current source to the first terminal of the first PN junction and the high current source to the first terminal of the second PN junction for providing the negative $\Delta V_{BE1}$ of the first PN junction to the first capacitor and the positive $\Delta V_{BE2}$ of the second PN junction to the second capacitor. There is a first feedback capacitor interconnected between the inverting output and non-inverting input and a second feedback capacitor interconnected between the non-inverting output and inverting input of the amplifier to define the gain on each of the $\Delta V_{BE}$ inputs to produce a differential voltage across the outputs representative of the average temperature of the PN junctions. First and second reset switching devices discharge the first and second feedback capacitors, respectively, and enable the amplifier to equalize its input in the auto zero mode.

In preferred embodiment the PN junctions may be included in a diode, in a transistor, in a bipolar transistor, or in a parasitic substrate bipolar transistor in a CMOS circuit. The current supply may include a plurality of low current generators and a high current generator, and current switching means for sequentially selecting one of the low current generators to implement the low current source and for combining the outputs of the remaining low current generators and the high current generator to establish the high current source. The circuit may include a multi-phase switch device for alternately interchanging in the temperature measurement mode the connection of the first and second capacitors with the amplifier inputs. There also may be included a synchronizer circuit for synchronously operating the switching device and the multi-phase switch device for alternately interconnecting each capacitor first to one PN junction and input and then to the other PN junction and input.

DISCLOSURE OF PREFERRED EMBODIMENT

Other objects, features and advantages will occur to those skilled in the art from the following description of a preferred embodiment and the accompanying drawings, in which.

Figure 1:
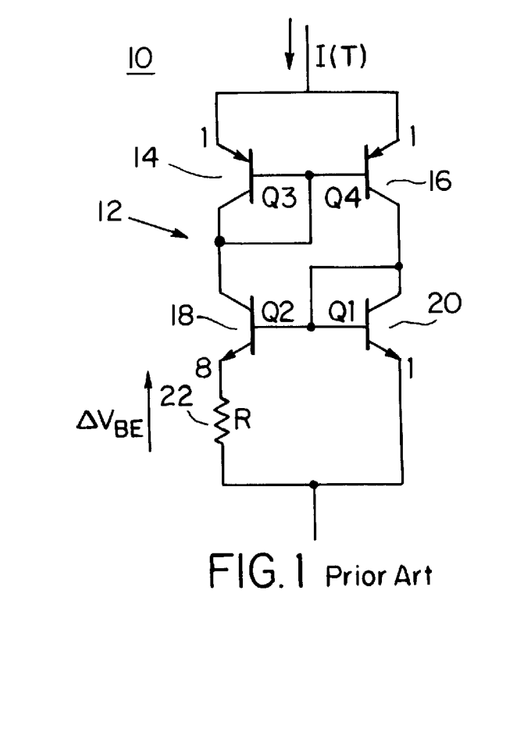
FIG. 1 is a schematic diagram of a prior art $\Delta V_{BE}$ temperature measuring circuit.

A technique of measuring temperature by comparing the voltages of two forward biased junctions operating at different current densities is known. Timko, Michael, "A Two-Terminal IC Temperature Transducer", *IEEE J. Solid State Circuits*, Vol. SC-11, December 1976. A simplified prior art temperature measuring circuit 10 FIG. 1 of this type illustrates how to generate a current that varies with absolute temperature in a standard bipolar process. The PNP current mirror 12 including transistors 14 and 16 forces equal current to flow in the unequal size NPN transistors 18 and 20. Actually transistor 18 has an area eight times the area of transistor 20. The difference in the base emitter voltage of transistors 18 and 20 may be written as $$\Delta V_{BE} = (kT/q) \cdot ln(I1 \cdot A2/I2 \cdot A1)$$

where k is Botlzmann's constant, q is electronic charge, T is absolute temperature, I1 and I2 are the currents used, and A1 and A2 are the emitter areas. In this example, as indicated, the currents are equal and the area ratio is 8:1. Thus $\Delta V_{BE}$ is equal to $(kt/q) \cdot ln(8)$ or at t=25° C., $\Delta V_{BE}$=53 mV approximately.

As can be seen from circuit 10, this voltage $\Delta V_{BE}$ is impressed across resistor 22 and so the value of the resistor 22 determines the current flowing in transistor 18 and thus in transistor 20. The total current flow may then be written $$I_T = [2 \cdot (k/q) \cdot ln(8)/R] \cdot T$$

and so is Proportional to Absolute Temperature or PTAT.

Transistors 14 and 16 may be lateral PNP devices; transistors 18 and 20 may be vertical NPN devices. If resistor 22 is set to a value of 358 ohms then the sensitivity of the circuit is 1 μA/°K. For a temperature range of −55° C. to +125° C., the current varies from 218 μA to 398 μA.

Three problems exist with the configuration of circuit 10. First, isolated bipolar transistors are required and so the circuit cannot be implemented in a low cost CMOS process. Second, precision low temperature coefficient resistors are required, such as for resistor 22, and third, good $V_{BE}$ matching is required between two transistors operating at different current densities.

Figure 2:
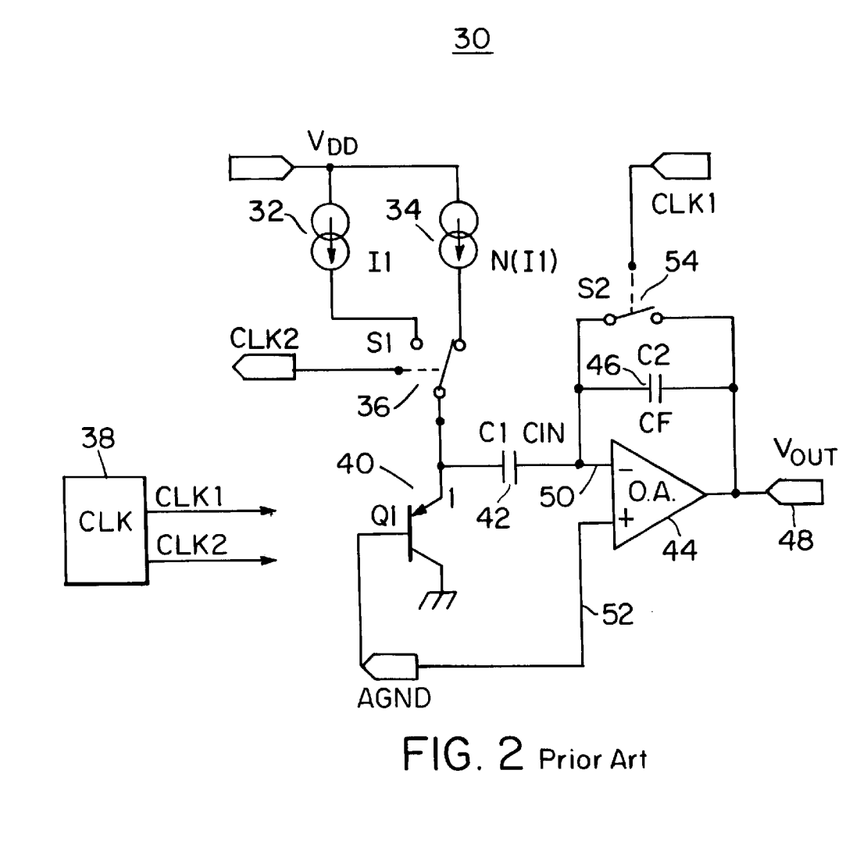
FIG. 2 is a schematic diagram of a switched current temperature sensor circuit.

The first of these problems can be addressed as explained in Bakker, A. and Huijsing, J. H., "Micropower CMOS Temperature Sensor with Digital Output", *IEEE J. Solid-State Circuits*, Vol. 31, July 1996, where is proposed the use of the parasitic substrate transistor in a standard CMOS process in which the $\Delta V_{BE}$ signal generated is processed in a CMOS amplifier which is chopped to remove the error due to offset voltage. However, the error due to $V_{BE}$ mismatch still remains and is very significant. For example, the area used by Bakker and Huijsing is also 8:1, giving the same $\Delta V_{BE}$ of 53 mV at ambient temperature. Thus a mere 1.06 mV mismatch corresponds to an error of 2% in temperature in degrees Kelvin or 6° C. As a continuous output is not required from a temperature sensor when used with an analog to digital converter, a single PNP may be used at switched currents I and N(I) as shown in switching temperature sensor circuit 30, FIG. 2, giving an output $$\Delta V_{BE} = (kT/q)ln(N)$$

where N is the current ratio. This change may be sampled by an analog to digital converter and converted to a digital word. The absolute value of the current used does not need to be controlled accurately, only the ratio, and so no precision resistors are required. Switching temperature sensor circuit 30, FIG. 2, includes a pair of current sources 32, 34 which provide currents I and N(I) through switch 36 controlled by clock signal CLK2 derived from clock circuit 38. The current flowing in PNP transistor 40 depends upon the position of switch 36. The base of transistor 40 and its collector are both connected to ground. Its emitter is connected through input capacitance 42 to the negative input of operational amplifier 44. Feedback capacitor 46 extends from the output 48 of op amp 44 to its input 50. The other input, positive input 52, to op amp 44 is connected to ground. Transistor 40 may be a substrate PNP, capacitors 42 and 46 may have values of 10 pF and 1 pF, and switch 36 and switch 54 shunting capacitor 46 may be implemented using NMOS switching transistors.

In operation, in the auto zero mode switch 36 is in the position shown and switch 54 is closed so the output 48 and the inputs 50 and 52 of operational amplifier 44 are all at ground. The voltage at the junction of capacitor 42 and the emitter of transistor 40 is at $V_{BE}$ as established by the current NI. In the temperature measuring mode switch 54 is opened. Nothing changes now until switch 36 is swung to the left. Now the voltage at the junction of capacitor 42 and the emitter of transistor 40 is at $V_{BE}I$. The difference between the present $V_{BE}I$ and the previous $V_{BE}NI$ appears at the left of capacitor 42 and is provided to the negative input 50 of operational amplifier 44, and then produces a positive change at VOUT at the output 48. This positive change is equal to $\Delta V_{BE}$ times the capacitance in capacitor 42 divided by the capacitance of feedback capacitor 46, or $\Delta V_{BE} \cdot C_{IN}/C_F$. Since $\Delta V_{BE}$ is equivalent to $(kT/q)n(N)$, that expression can be written as $(kt/q)n(N) \cdot C_{IN}/C_F$ and can be solved for the temperature T. The currents I and NI in FIG. 2 may have values of 1 μA and 10 μA. Capacitors 42 and 46 may have values of 10 pF and 1 pF, transistor 40 may be a substrate PNP, and switches 36 and 54 may be implemented with NMOS transistors.

In accordance with this invention, not one but two $\Delta V_{BE}$ signals are summed in a differential manner and amplified in order to increase the value of the sensed signal and improve the signal to noise ratio. Such a switched current temperature circuit 60, FIG. 3, includes two current sources 32a and 34a and two switches 62, 64 which selectively interchange the currents I and NI with transistors 66 and 68. Input capacitors 70 and 72 interconnect the outputs of transistors 66 and 68 with the positive input 74 and negative input 76, all respectively, of op amp 78. Op amp 78 has a negative output 80 corresponding to positive input 74 and a positive output 82 corresponding to negative input 76. Feedback capacitor 84 shunted by switch 87 extends from the output 80 to input 74 while feedback capacitor 86 shunted by switch 88 extends from output 82 to input 76. In the auto zero mode, switches 87 and 88 are closed, switches 62 and 64 are in the right-hand position as shown, and both the inputs 74, 76 and the outputs 80, 82 are at the common mode voltage VCM available at the common mode terminal 90 because of the shunting function of the closed switches 87 and 88. The left-hand side of capacitor 70 is at a voltage $V_{BE}$ defined by current NI flowing through transistor 66. The voltage on the left-hand side of capacitor 72 is $V_{BE}$ equivalent to the voltage on transistor 68 determined by the current I. In the temperature measuring mode switches 87 and 88 are opened, removing the shunt effect and reestablishing capacitors 84 and 86 as the primary feedback path. Switches 62 and 64 are now swung to the left in FIG. 3 and interchanging the voltages on the left-hand side of capacitors 70 and 72, creating $\Delta V_{BE}$ such that the voltage $-\Delta V_{BE}$ is the input to capacitor 70 and $+\Delta V_{BE}$ is the input to capacitor 72. These voltages produce an output from op amp 78 across outputs 80 and 82 so that the signal is $2\Delta V_{BE} \cdot C_{IN}/C_F$. For the same signal to noise performance, the signal in the basic circuit of FIG. 2 would need switching currents of I and $N^2$I so a significant reduction of power dissipation is achieved.

Figure 3:
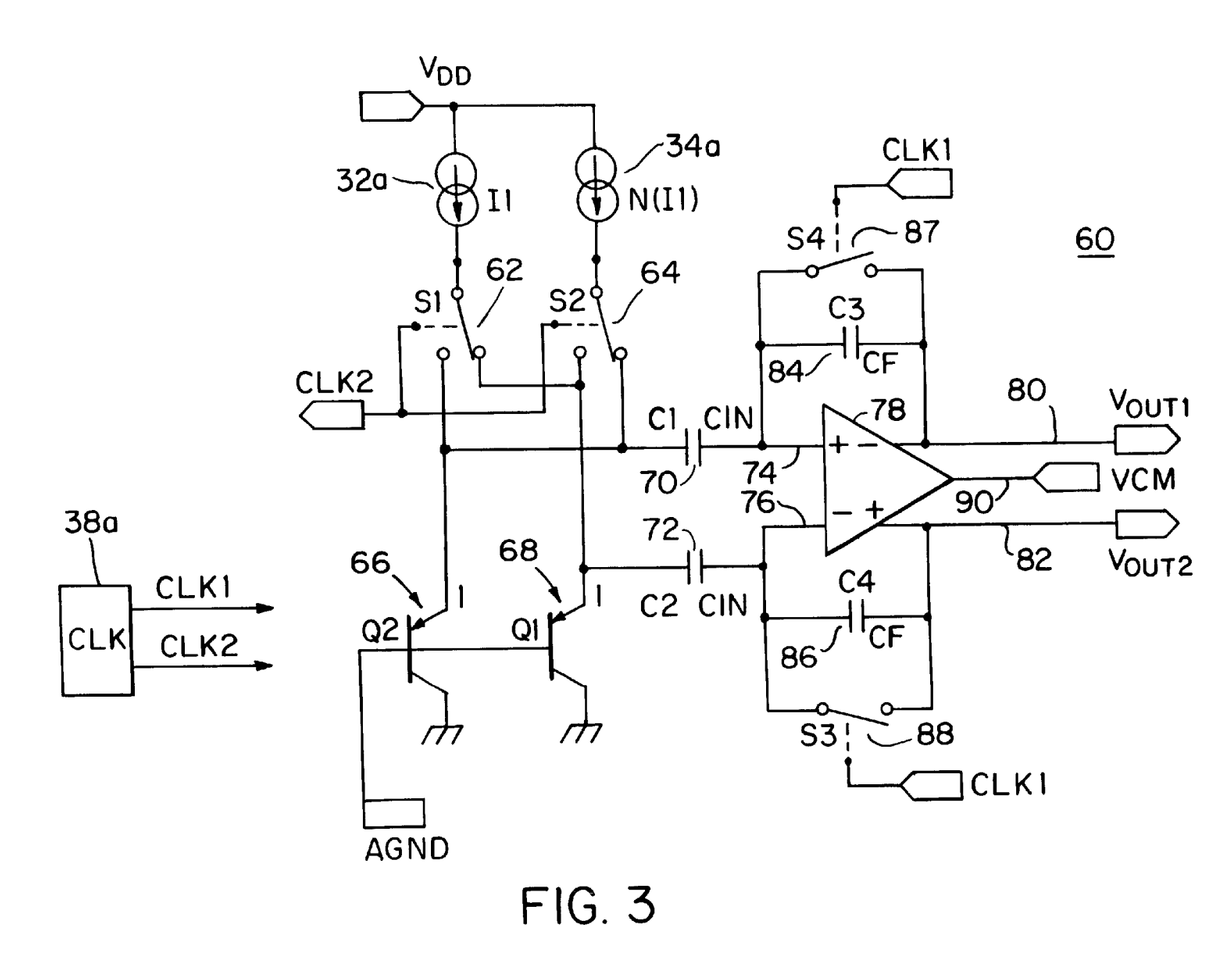
FIG. 3 is a schematic diagram of a differential switched current temperature sensor circuit with double $\Delta V_{BE}$ according to this invention.
Figure 4:
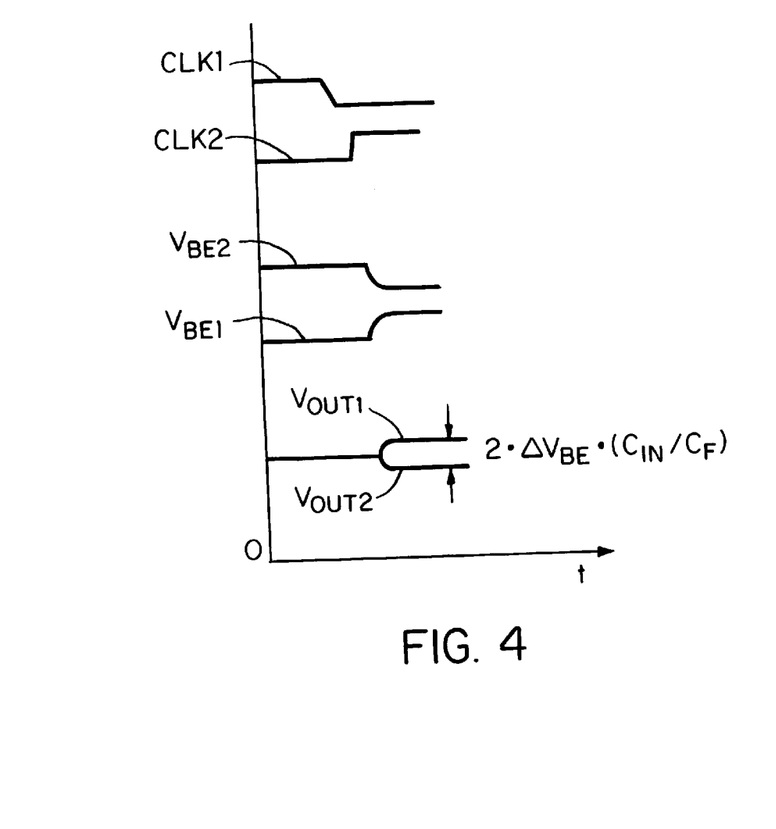
FIG. 4 is an illustration of waveforms that occur in the circuit of FIG. 3.

Clock 38a provides clock signals CLK1 and CLK2 which synchronously switch switches 62, 64, 87 and 88 to apply the voltages $V_{BE1}$ and $V_{BE2}$ to the left side of capacitors 70 and 72 to produce VOUT1 and VOUT2 signals which are of opposite polarity and summed to provide a compound $\Delta V_{BE}$ signal equivalent to $2 \cdot \Delta V_{BE} \cdot (C_{IN}/C_F)$, where $C_{IN}$ is the value of capacitors 70 and 72 and $C_F$ is the value of capacitors 84 and 86.

Figure 5:
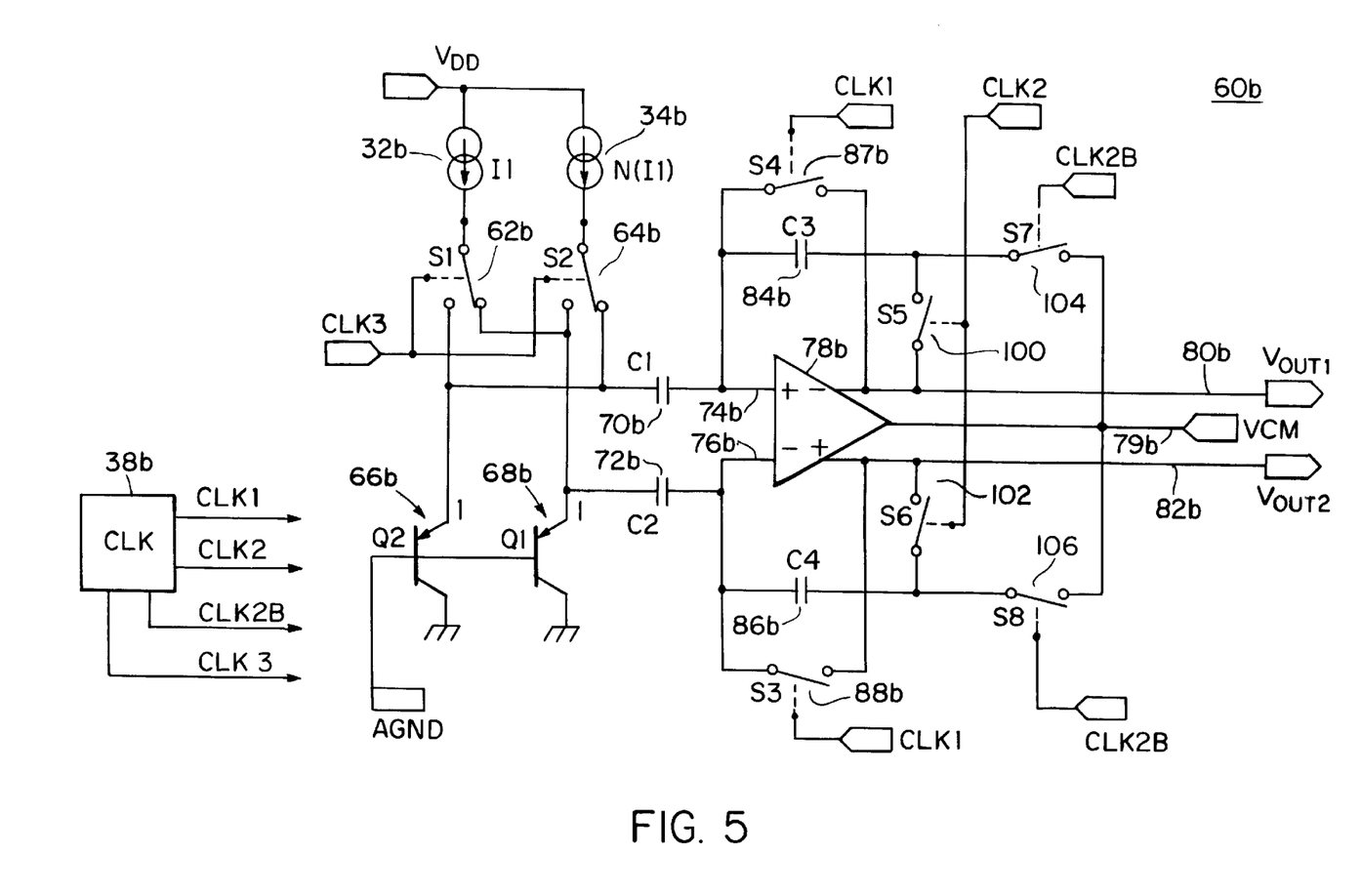
FIG. 5 is a schematic diagram of a switched current temperature sensor circuit similar to that of FIG. 3 with offset cancellation according to this invention.

Amplifier 78 typically will have offset and 1/F noise, but it may be auto zeroed as is well known, by storing the offset voltage in the feedback capacitors in the auto zero mode so that when the measurement mode is engaged the correcting offset is applied. Such a circuit similar to circuit 60 but with offset cancellation circuit 60b, FIG. 5, adds four switches 100 and 102 between feedback capacitors 84b and 86b and outputs 80b and 82b, respectively, and switches 104, 106 between feedback capacitors 84b, 86b and common mode output 79b, respectively. The circuit operates the same as circuit 60, FIG. 3, with the addition of switches 100, 102, 104 and 106. In auto zero mode, switch 100 is open and switch 87b is closed, switch 104 is closed, connecting capacitor 84b to the common mode voltage 79b, thereby storing the offset of the amplifier with respect to the positive input 74b of the amplifier. In the temperature measurement mode, switch 87b is open as is switch 104. Switch 100 is closed. Now the stored offset in capacitance 84b is connected to the output 80b, VOUT1 and cancels the offset with respect to the input. In a similar fashion, switches 106, 102 and 88b are operated to cancel the offset with respect to the negative input 76b of op amp 78b through the synchronous operation of clock signals CLK1, CLK2, CLK2b and CLK3 provided by clock 38b to provide VOUT2 at 82b. Switches 100, 102, 104 and 106 may be implemented, for example, with NMOS transistors.

Figure 6:
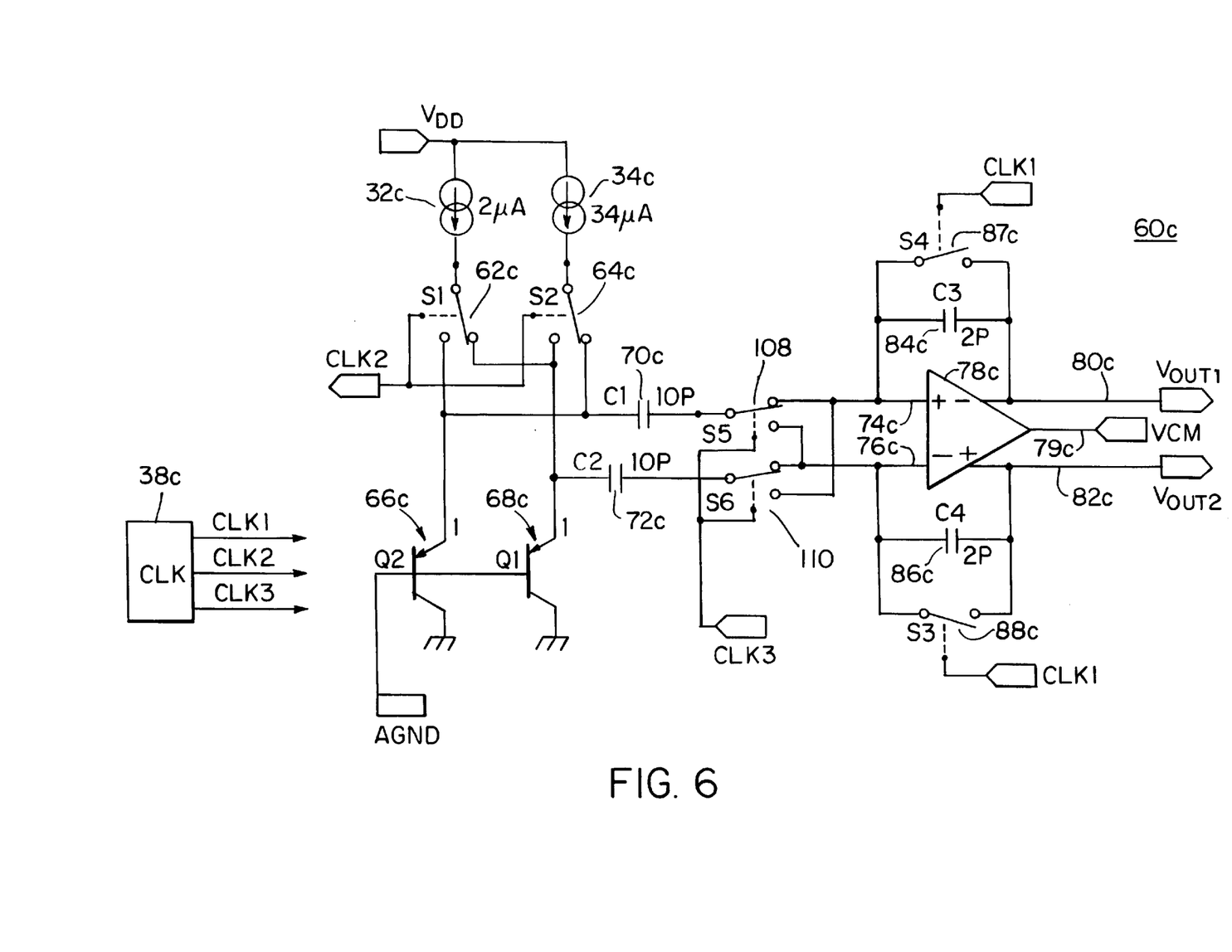
FIG. 6 is a schematic diagram of a switched current temperature circuit similar to that of FIG. 4 with multiphase current switching according to this invention.
Figure 7:
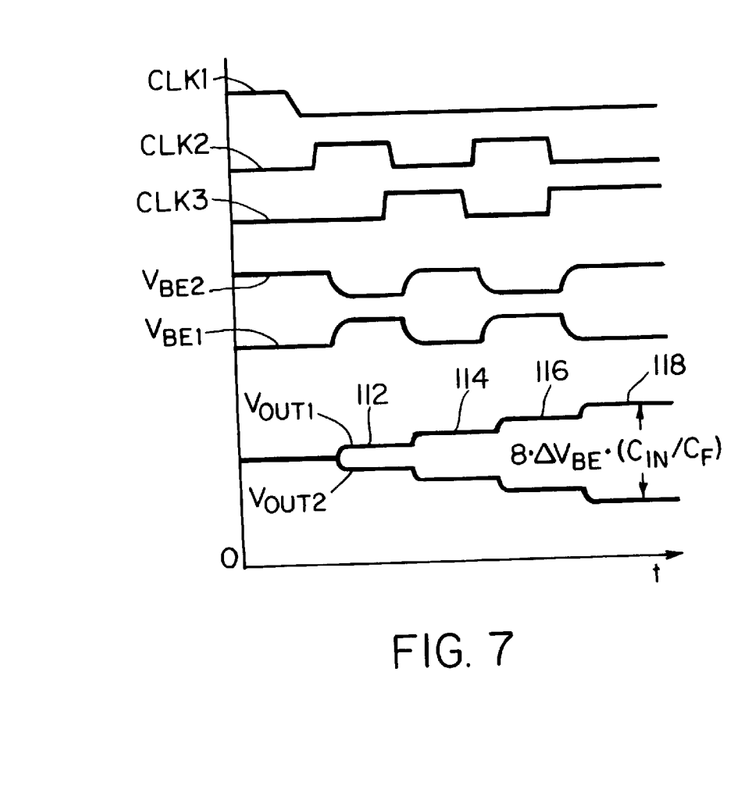
FIG. 7 is an illustration of waveforms that occur in the circuit of FIG. 6.

Further compounding can be accomplished by taking multiple $\Delta V_{BE}$ samples by switching the I and the NI currents back and forth several times and summing the samples. This has the effect of averaging the temperature over the time taken. This is done in multiphase circuit 60c, FIG. 6, by adding switches 108 and 110 on the right-hand side of the input capacitors 70c, 72c. Switches 108 and 110 are operated synchronously with switches 62c, 64c, 87c and 88c by clock 38c, whose signals CLK1, CLK2, CLK3 are shown in FIG. 7. In the measurement mode with switches 87c and 88c open, clock signals CLK2 and CLK3 are synchronously applied to produce the alternating VBE2 and $V_{BE1}$ signals, FIG. 7, which provide successive accumulations that sum up to provide $V_{OUT1}$ and $V_{OUT2}$ in successively increasing symmetrical steps 112, 114, 116 and 118 which after four cycles provide an output signal equal to $8 \cdot \Delta V_{BE} \cdot (C_{IN}/C_F)$. Of course, the number of cycles is arbitrary and while more than one, could be as few as two or as many as desired beyond four.

There is a degree of freedom in the choice of current ratio N and the capacitor ratio $C_{IN}/C_F$ for a given sensitivity in output voltage. The output is typically measured by a 10-bit analog to digital converter with a 2.5 volt reference and should have a sensitivity of 0.25 degrees per least significant bit (LSB) or four LSB's per degree, for example. In such a case, the resulting expression for capacitor ratio may be calculated as follows:

$$(8 \cdot k/q) \cdot \ln(N) \cdot (Cin/Cf) = (4) \cdot (2.5/1024) \cdot (Cin/Cf)$$

$$= [(1.25) \cdot q]/[(1024) \cdot (k) \cdot \ln(N)]$$

$$= [(1.25) \cdot (1.602192e - 19)]/[(1024) \cdot$$

$$(1.380623e - 23) \cdot \ln(N)]$$

For the current ratio of 8, this needs a ratio $C_{IN}/C_F$ of 6.812443, which would be difficult to manufacture accurately. A better solution is to use a current ratio of 17 which results in a required capacitor ratio of 5.000003 within one PPM of an integer number, easy to lay out as multiple unit capacitors and to manufacture with good repeatability. A value of 10 pF is chosen for $C_{IN}$ based on kT/C noise consideration. The 17:1 ratio current sources can be made with an array of unit PMOS devices laid out with the same practices used for 8 and 10 bit current source digital to analog converters. Thus matching data can be predicted as well within the requirements of the temperature sensor. A different unit device is chosen for each of the four different $\Delta V_{BE}$ samples, thus averaging the ratio error. The value of current source used must be kept low to minimize self-heating. A unit value of 2 microamps can be used as a compromise between speed, power, noise and accuracy. Such a construction is shown in the switched current temperature sensing circuit 60d, FIG. 8, wherein the current supply includes four current sources 130, 132, 134 and 136, each producing a 2 microamp current, and a fifth current source 138 which provides a 28 microamp current source. The current flowing in each of the current sources 130–138 is represented as I1, I2, I3, I4 and I5 and is controlled by switches 140, 142, 144, 146 and 148. Current switching is arranged with respect to clock 38b and clock output CLK SWDR so that I1 is ratioed versus I2, I3, I4 and I5 first, then I2 is ratioed against I1, I3, I4 and I5, then I3 is ratioed against I1, I2, I4 and I5, and finally I4 is ratioed against I1, I2, I3 and I5. Thus the total current flowing is always 2 microamps through one of the transistors and 34 microamps through the other, providing the desired ratio of 17:1. With this current ratio and capacitor ratio the circuit now gives the following:

T=−55° C.:dVOUT=2.1307
T=+25° C.:dVOUT=2.911619
T=+125° C.:dVOUT=3.888181

Figure 8:
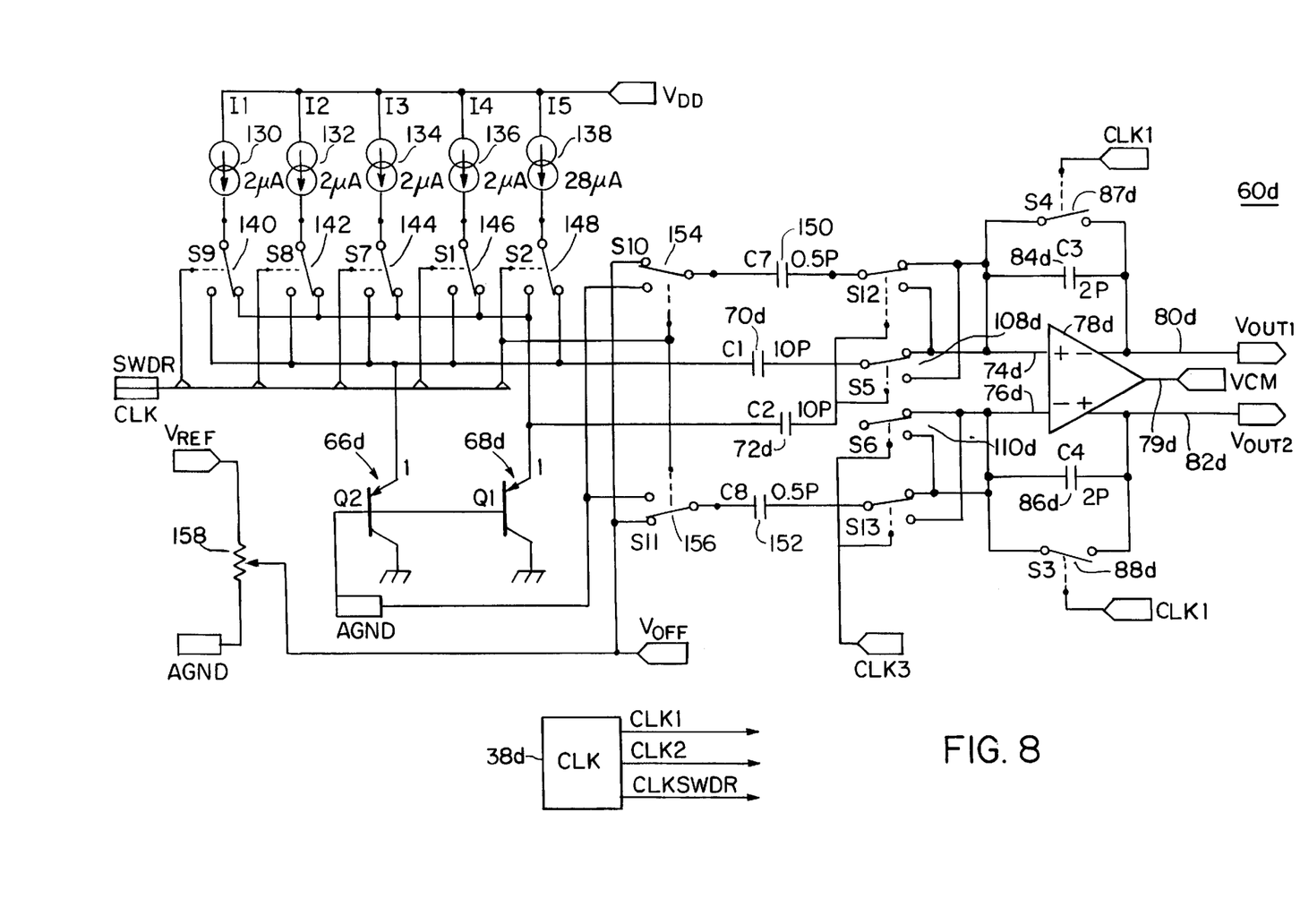
FIG. 8 is a schematic diagram of a switched current temperature circuit similar to that of FIG. 6 with switched current sources and range offset according to this invention.

The output thus ranges from 2.1307 to 3.888181, but ideally should be offset to lie within the 0–2.5 volt range of a typical ADC. This offset is chosen so that the midscale corresponds to room temperature or 25° C. This is done simply, as also shown in FIG. 8, by adding two additional capacitors 150, 152 having a typical value of 0.5 pF, and two additional switches 154 and 156 which apply an offset voltage $V_{OFF}$ derived from the analog to digital converter reference voltage $V_{REF}$ and resistance 158.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A switched current temperature circuit with compounded $\Delta V_{BE}$ comprising:

an amplifier having an inverting input with corresponding non-inverting output and a non-inverting input with a corresponding inverting output;

a first PN junction connected to said non-inverting input through a first input capacitor and a second PN junction connected to said inverting input through a second input capacitor;

a current supply including a low current source and a high current source;

a switching device for applying in an auto zero mode the high current source to a first terminal of said first PN junction and the low current source to a first terminal of said second PN junction for providing the $V_{BE1}$ of said first junction to said first capacitor and providing the $V_{BE2}$ of said second junction to said second capacitor and for applying in a temperature measurement mode the low current source to said first terminal of said first PN junction and the high current source to said first terminal of said second PN junction for providing the negative $\Delta V_{BE1}$ of the first PN junction to said first capacitor and the positive $\Delta V_{BE2}$ of the second PN junction to said second capacitor;

a first feedback capacitor interconnected between the inverting output and non-inverting input and a second feedback capacitor interconnected between the non-inverting output and inverting input of said amplifier to define the gain on each of the $\Delta V_{BE}$ inputs to produce a differential voltage across the outputs representative of the average temperature of said PN junctions; and first and second reset switching devices for discharging said first and second feedback capacitors, respectively, and for enabling said amplifier to equalize its inputs in the auto zero mode.

2. The switched current temperature circuit with compounded $\Delta V_{BE}$ of claim 1 in which at least one of said PN junctions is included in a diode.

3. The switched current temperature circuit with compounded $\Delta V_{BE}$ of claim 1 in which at least one of said PN junctions is included in transistors.

4. The switched current temperature circuit with compounded $\Delta V_{BE}$ of claim 1 in which said PN junction is included in a bipolar transistor.

5. The switched current temperature circuit with compounded $\Delta V_{BE}$ of claim 1 in which at least one of said PN junctions is included in a parasitic substrate bipolar transistor in a CMOS circuit.

6. The switched current temperature circuit with compounded $\Delta V_{BE}$ of claim 5 in which the collector of each of said transistors is connected to ground.

7. The switched current temperature circuit with compounded $\Delta V_{BE}$ of claim 1 in which said current supply includes a plurality of low current generators, a high current generator, and current switching means for sequentially selecting one of said low current generators to implement said low current source and for combining the outputs of the remaining low current generators and the high current generator to establish said high current source.

8. The switched current temperature circuit with compounded $\Delta V_{BE}$ of claim 1 further including a multi-phase switched device for alternately interchanging in the temperature measurement mode the connection of said first and second capacitors with said amplifier inputs.

9. The switched current temperature circuit with compounded $\Delta V_{BE}$ of claim 1 further including a synchronizing circuit for synchronously operating said switching device and a multiphase switch device for alternately interconnecting each said capacitor to one PN junction and input and then to the other PN junction and input.

* * * * *